United States Patent
Khlat

(10) Patent No.: US 11,159,144 B2
(45) Date of Patent: Oct. 26, 2021

(54) RADIO FREQUENCY MULTIPLEXER

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 83 days.

(21) Appl. No.: 16/742,051

(22) Filed: Jan. 14, 2020

(65) Prior Publication Data
US 2020/0259482 A1 Aug. 13, 2020

Related U.S. Application Data

(60) Provisional application No. 62/802,279, filed on Feb. 7, 2019.

(51) Int. Cl.
| | |
|---|---|
| *H03H 9/72* | (2006.01) |
| *H03H 9/70* | (2006.01) |
| *H04B 1/00* | (2006.01) |
| *H03H 9/02* | (2006.01) |
| *H03H 9/64* | (2006.01) |

(Continued)

(52) U.S. Cl.
CPC .......... *H03H 9/72* (2013.01); *H03H 9/02118* (2013.01); *H03H 9/02818* (2013.01); *H03H 9/566* (2013.01); *H03H 9/6433* (2013.01); *H03H 9/66* (2013.01); *H03H 9/68* (2013.01); *H03H 9/703* (2013.01); *H04B 1/0057* (2013.01)

(58) Field of Classification Search
CPC .. H03H 9/72; H03H 9/02118; H03H 9/02818; H03H 9/703; H03H 9/6433; H03H 9/66; H03H 9/68; H03H 9/566; H03H 9/725; H03H 9/706; H04B 1/0057; H04B 1/0067
USPC .................................................. 333/132, 133
See application file for complete search history.

(56) References Cited

U.S. PATENT DOCUMENTS 9,929,769 B1 3/2018 Guyette et al.
10,298,206 B2 * 5/2019 Uehara ................ H03H 7/0161
(Continued)

FOREIGN PATENT DOCUMENTS

JP 2019036856 A 3/2019

OTHER PUBLICATIONS

Office Action for German Patent Application No. 102020201415.9, dated Oct. 29, 2020, 13 pages.
(Continued)

*Primary Examiner* — Robert J Pascal
*Assistant Examiner* — Jorge L Salazar, Jr.
(74) *Attorney, Agent, or Firm* — Withrow & Terranova, PLLC

(57) ABSTRACT

Disclosed is a radio frequency multiplexer having an M number of multiplexer branches each having an outer port terminal coupled to a common outer node, wherein M is a positive counting number. Each of the M number of multiplexer branches comprises a multi-bandpass filter configured to filter an N number of bands multiplexed by the radio frequency multiplexer to pass an individual group of N/M bands, wherein N is a positive counting number greater than one and equal to a total number of bands to be multiplexed. Each of the M number of multiplexer branches further includes an N/M number of resonator branches each having a band port terminal configured to pass a single band and an inner branch terminal coupled to an inner port terminal of the multi-bandpass filter at a common inner node.

20 Claims, 9 Drawing Sheets

(51) Int. Cl.
*H03H 9/66* (2006.01)
*H03H 9/68* (2006.01)
*H03H 9/56* (2006.01)

(56) References Cited

U.S. PATENT DOCUMENTS

2016/0294031 A1 10/2016 Cheng et al.
2017/0302252 A1* 10/2017 Hey-Shipton ........ H04B 1/3833
2019/0058452 A1 2/2019 Takata

OTHER PUBLICATIONS

Office Action for German Patent Application No. 102020201415.9, dated Apr. 23, 2021, 16 pages.

* cited by examiner

RADIO FREQUENCY MULTIPLEXER

RELATED APPLICATIONS

This application claims the benefit of provisional patent application Ser. No. 62/802,279, filed Feb. 7, 2019, the disclosure of which is hereby incorporated herein by reference in its entirety.

FIELD OF THE DISCLOSURE

The present disclosure relates to radio frequency filters and in particular to radio frequency multiplexers comprising radio frequency filters used in radio frequency transmitters and receivers.

BACKGROUND

As wireless communications standards continue to evolve to provide higher data rates, reliability, and network capacity, technologies such as carrier aggregation have become commonplace. Wireless communications devices utilizing carrier aggregation may simultaneously transmit and receive signals within different wireless operating bands over a single antenna. These wireless communications devices require specialized filtering circuitry such as radio frequency multiplexers to route signals within the different wireless operating bands through different transmit and receive paths. To provide required isolation between different wireless operating bands, radio frequency front-end circuitry employing radio frequency multiplexers generally includes a relatively large number of additional filtering components, which increases the complexity and size of the radio frequency front-end circuitry. What is needed is a radio frequency multiplexer that increases isolation with a relatively smaller number of filtering components.

SUMMARY

Disclosed is a radio frequency multiplexer having an M number of multiplexer branches each having an outer port terminal coupled to a common outer node, wherein M is a positive counting number. Each of the M number of multiplexer branches comprises a multi-bandpass filter configured to filter an N number of bands multiplexed by the radio frequency multiplexer to pass an individual group of N/M bands, wherein N is a positive counting number greater than one and equal to a total number of bands to be multiplexed. Each of the M number of multiplexer branches further includes an N/M number of resonator branches each having a band port terminal configured to pass a single band and an inner branch terminal coupled to an inner port terminal of the multi-bandpass filter at a common inner node.

Additional exemplary embodiments further include a mirrored cancellation network coupled between common inner nodes of adjacent ones of the M number of multiplexer branches. The mirrored cancellation network is configured to cancel undesirable signal leakage that may occur between the adjacent ones of the M number of multiplexer branches.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
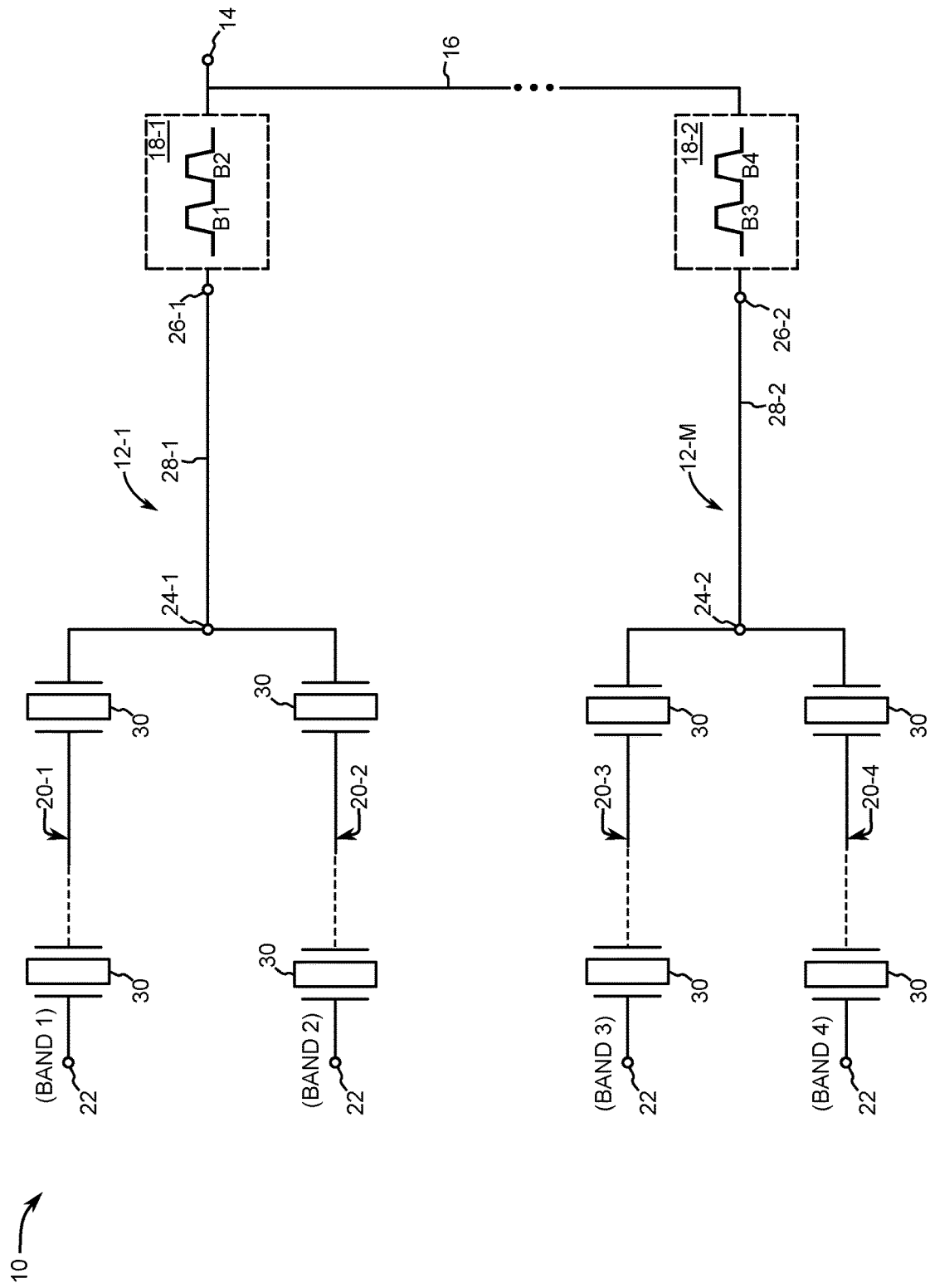
FIG. 1 is a schematic of a first exemplary embodiment of a radio frequency multiplexer that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of a first exemplary embodiment of a radio frequency multiplexer 10 that is structured in accordance with the present disclosure. The radio frequency multiplexer 10 includes an M number of multiplexer branches 12-1 through 12-M. Each of the M number of multiplexer branches 12-1 through 12-M has an outer port terminal 14 coupled to a common outer node 16, wherein M is a positive counting number greater than one. Moreover, each of the M number of multiplexer branches 12-1 through 12-M includes a multi-bandpass filter 18 configured to filter an individual group of N/M bands from a total number of bands multiplexed by the radio frequency multiplexer 10, wherein N is an positive counting number equal to the total number of bands multiplexed by the radio frequency multiplexer 10. Further still, each of the M number of multiplexer branches 12-1 through 12-M also includes an N/M number of an N number of resonator branches 20. In the first exemplary embodiment of FIG. 1, M is equal to two and N is equal to four. Thus, in the exemplary embodiment of FIG. 1, there is two of the multi-bandpass filters 18. In this particular case, there is a first multi-bandpass filter 18-1 and a second multi-bandpass filter 18-2 associated with four of the resonator branches 20 divided between the M number of multiplexer branches 12-1 through 12-M, which in this case are labeled 20-1 through 20-4. In the exemplary embodiment of FIG. 1, the first multi-bandpass filter 18-1 is configured to pass a first band B1 and a second band B2, whereas the second multi-bandpass filter 18-2 is configured to pass a third band B3 and a fourth band B4.

In general, each of the N number of resonator branches 20 is configured to pass a single band of the N number of total bands between a band port terminal 22 and an inner branch terminal 24. An inner port terminal 26 of the multi-bandpass filter 18 is coupled to the inner branch terminal 24 through a common inner node 28. In the exemplary embodiment depicted in FIG. 1, the first multiplexer branch 12-1 includes a first inner branch terminal 24-1, a first inner port terminal 26-1, and a first common inner node 28-1. The last multiplexer branch 12-M, includes a second inner branch terminal 24-2, a second inner port terminal 26-2, and a second common inner node 28-2 because M is equal to two in this example.

Each of the N number of resonator branches 20 is configured to predominately pass an individual band of frequencies out of an N number of bands by filtering the individual band of frequencies from other ones of the N number of bands. In exemplary embodiments, each of the N number of resonator branches 20 is comprised of a plurality of acoustic resonators 30 that are coupled between the band port terminal 22 and the inner port terminal 26. The plurality of acoustic resonators 30 of each of the N number of resonator branches 20 is arranged into an acoustic filter configuration that predominately passes an associated individual band of frequencies by filtering the associated individual band of frequencies from other ones of the N number of bands. In exemplary embodiments, the acoustic filter configuration has the plurality of acoustic resonators 30 coupled in series between the band port terminal 22 and the inner port terminal 26 of each of the N number of resonator branches 20. In some embodiments, each of the plurality of acoustic resonators 30 is a surface acoustic wave (SAW) type resonator. In other embodiments, each of the plurality of acoustic resonators 30 is a bulk acoustic wave (BAW) type resonator. SAW type resonators are typically selected for bands of frequencies below 1.5 GHz, whereas BAW type resonators are typically selected for higher bands of frequencies that are above 1.5 GHz.

Figure 2:
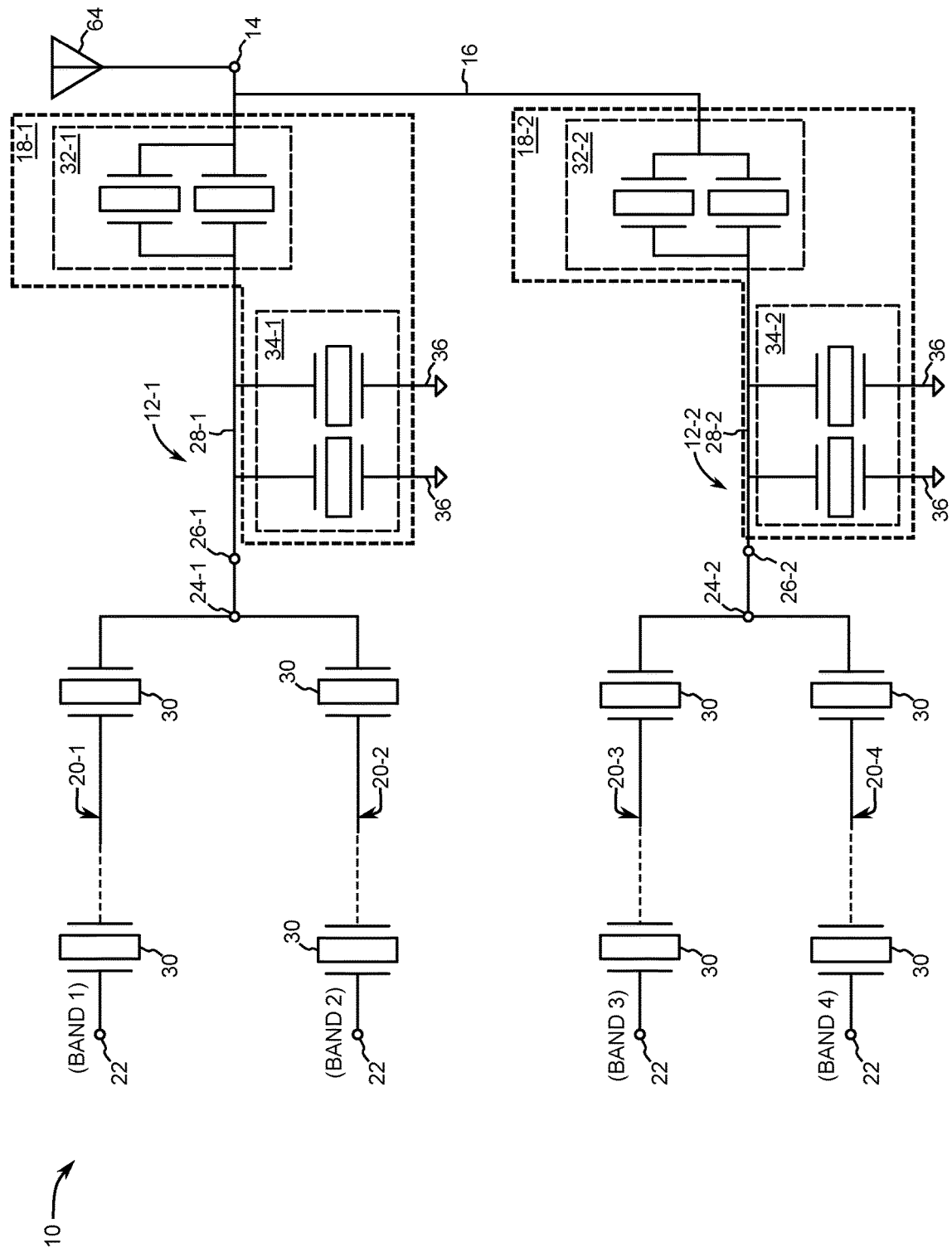
FIG. 2 is a schematic of the first exemplary embodiment of the radio frequency multiplexer showing an exemplary structure of a multi-bandpass filter included in each of a number of multiplexer branches that comprise the radio frequency multiplexer.

FIG. 2 is a schematic of the first exemplary embodiment of the radio frequency multiplexer 10 showing an exemplary structure of the multi-bandpass filter 18 of each of the M number of multiplexer branches 12-1 through 12-M. In this exemplary case, each multi-bandpass filter 18 includes a plurality of series resonators 32 coupled in parallel between the outer port terminal 14 and the inner port terminal 26. The plurality of series resonators 32 is associated with the individual group of N/M bands passed by the multi-bandpass filter 18. In particular, the plurality of series resonators 32 is configured to provide low impedance paths between the outer port terminal 14 and the inner port terminal 26 for the individual group of N/M bands passed by the multi-bandpass filter 18 while providing substantially higher impedance to undesired bands of frequencies.

Further, in this exemplary case, each multi-bandpass filter 18 may also include a plurality of shunt resonators 34 coupled in parallel between the common inner node 28 and a fixed voltage node 36, which in this exemplary case is ground. The plurality of shunt resonators 34 is configured to pass undesired bands of frequencies away from the common inner node 28 and to the fixed voltage node 36 while also providing substantially higher impedance to the individual group of N/M bands to prevent the individual group of N/M bands from being shunted from the common inner node 28 to the fixed voltage node 36.

Figure 3:
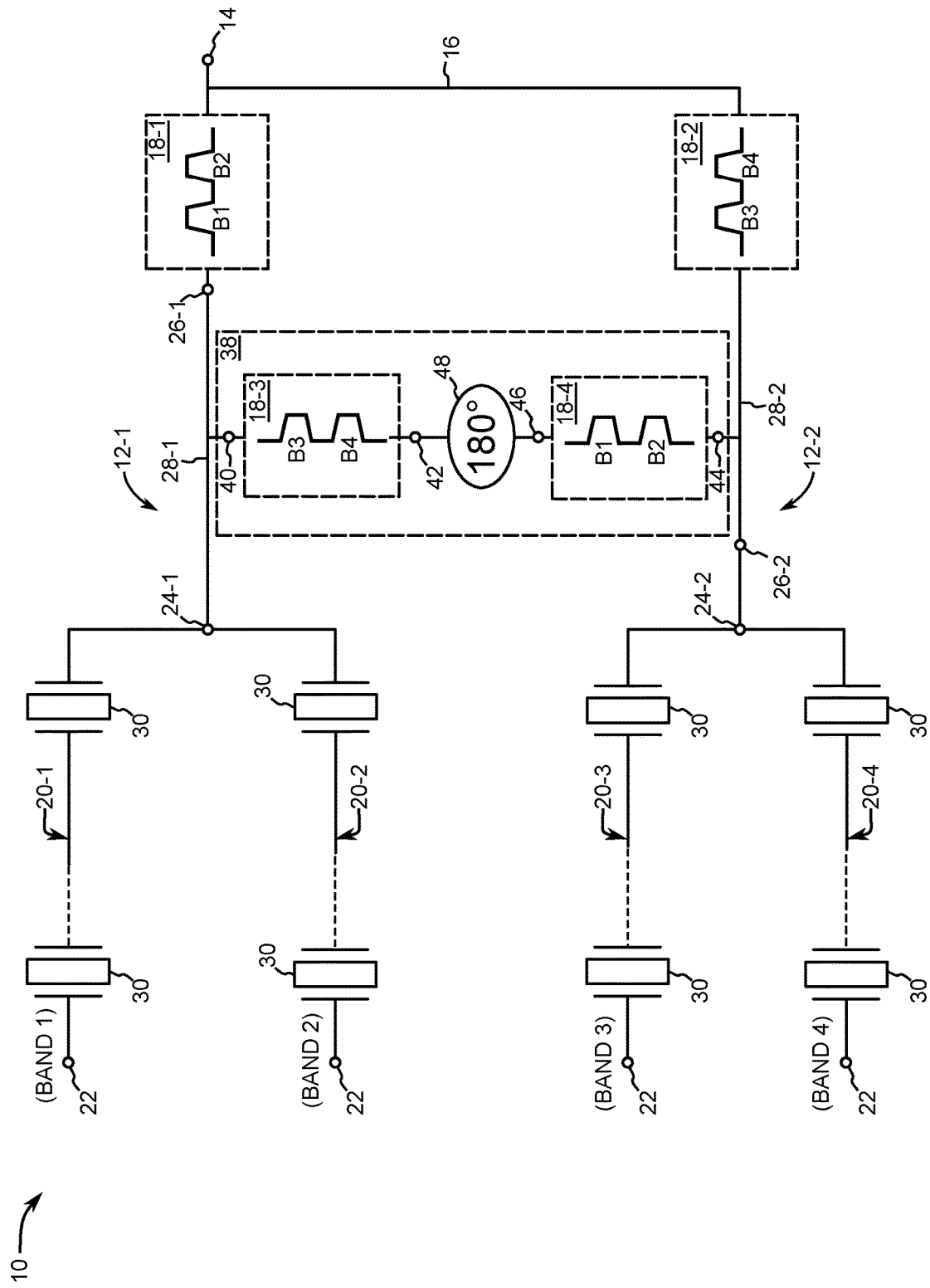
FIG. 3 is a schematic of a second exemplary embodiment of the radio frequency multiplexer depicting a mirrored cancellation network coupled between common inner nodes of adjacent ones of the M number of multiplexer branches.

FIG. 3 is a schematic of a generalized second embodiment of the radio frequency multiplexer 10 depicting a mirrored cancellation network 38 that is coupled between a first common inner node 28-1 and a second common inner node 28-2 of adjacent ones of the M number of multiplexer branches 12, which in this exemplary case are a first multiplexer branch 12-1 and a second multiplexer branch 12-2. In this exemplary case, the mirrored cancellation network 38 is configured to cancel undesirable signal leakage that may occur between the first multiplexer branch 12-1 and the second multiplexer branch 12-2.

In the example of FIG. 3, the number of bands to be multiplexed is four, thus in this exemplary case N equals 4. Correspondingly, the number of multiplexer branches 12 is two, thus in this exemplary case M equals 2. As such, there are two individual groups of N/M bands because N=4 divided by M=2 is 2.

In this exemplary case, a first multi-bandpass filter 18-1 is configured to provide a first passband response tuned for a first band B1 and a second passband response tuned for a second band B2. A second multi-bandpass filter 18-2 is configured to provide a third passband response tuned for a third band B3 and also provide a fourth passband response tuned for a fourth band B4. In this particular case, the mirrored cancellation network 38 is configured to cancel signals from the first band B1 and the second band B2 that leak from the common outer node 16 to the second common inner node 28-2 through the second multi-bandpass filter 18-2. Moreover, the mirrored cancellation network 38 is further configured to cancel signals from the third band B3 and the fourth band B4 that leak through the first multi-bandpass filter 18-1 from the common outer node 16 to the first common inner node 28-1.

In this second exemplary embodiment of the radio frequency multiplexer 10, the mirrored cancellation network 38 includes a third multi-band pass filter 18-3 that is configured to provide the third passband response tuned for the third band B3 and also provide the fourth passband response tuned for the fourth band B4. The third multi-band pass filter 18-3 has a first filter terminal 40 coupled to the first common inner node 28-1 and a second filter terminal 42. The mirrored cancellation network 38 also includes a fourth multi-band pass filter 18-4 that is configured to provide the first passband response tuned for the first band B1 and also provide the second passband response tuned for the second band B2. The fourth multi-band pass filter 18-4 has a third filter terminal 44 coupled to the second common inner node 28-2 and a fourth filter terminal 46. A 180° phase shifter 48 is coupled between the second filter terminal 42 and the fourth filter terminal 46.

In general, the third multi-bandpass filter 18-3 is considered a first shunt multi-bandpass filter having the first filter terminal 40 coupled to the first common inner node 28-1 of a first one of an adjacent pair of the M number of multiplexer branches such as the first multiplexer branch 12-1. Moreover, the fourth multi-bandpass filter 18-4 is considered a second shunt multi-bandpass filter having the third filter terminal 44 coupled to the second common inner node 28-2 of a second one of the adjacent pair of the M number of multiplexer branches such as the second multiplexer branch 12-2. The phase shifter 48 is coupled between the second filter terminal 42 and the fourth filter terminal 46. The third multi-bandpass filter 18-3 is configured to pass signals passed by the second one of the adjacent pair of the M number of multiplexer branches, which in this exemplary case is the second multiplexer branch 12-2. The fourth multi-bandpass filter 18-4 is configured to pass signals passed by the first one of the adjacent pair of the M number of multiplexer branches, which in this exemplary case is the first multiplexer branch 12-1.

In operation, signals passed by the second multiplexer branch 12-2 and that leak from the common outer node 16 into the first common inner node 28-1 as undesired signals are shunted through the third multi-bandpass filter 18-3 to the phase shifter 48. As the undesired signals pass through the phase shifter 48, they are phase shifted 180°±5° such that they destructively cancel with signals that also leak from the second multiplexer branch 12-2 through the fourth multi-bandpass filter 18-4. In mirror fashion, signals passed by the first multiplexer branch 12-1 and that leak from the common outer node 16 into the second common inner node 28-2 as undesired signals are shunted through the fourth multi-bandpass filter 18-4 to the phase shifter 48. As the undesired signals pass through the phase shifter 48, they are phase shifted 180°±5° such that they destructively cancel with signals that also leak from the first multiplexer branch 12-1 through the third multi-bandpass filter 18-3. More generally, the destructive cancellation of the undesired signals relatively greatly increases isolation between the adjacent pair of the M number of multiplexer branches, such as the first multiplexer branch 12-1 and the second multiplexer branch 12-2.

Figure 4:
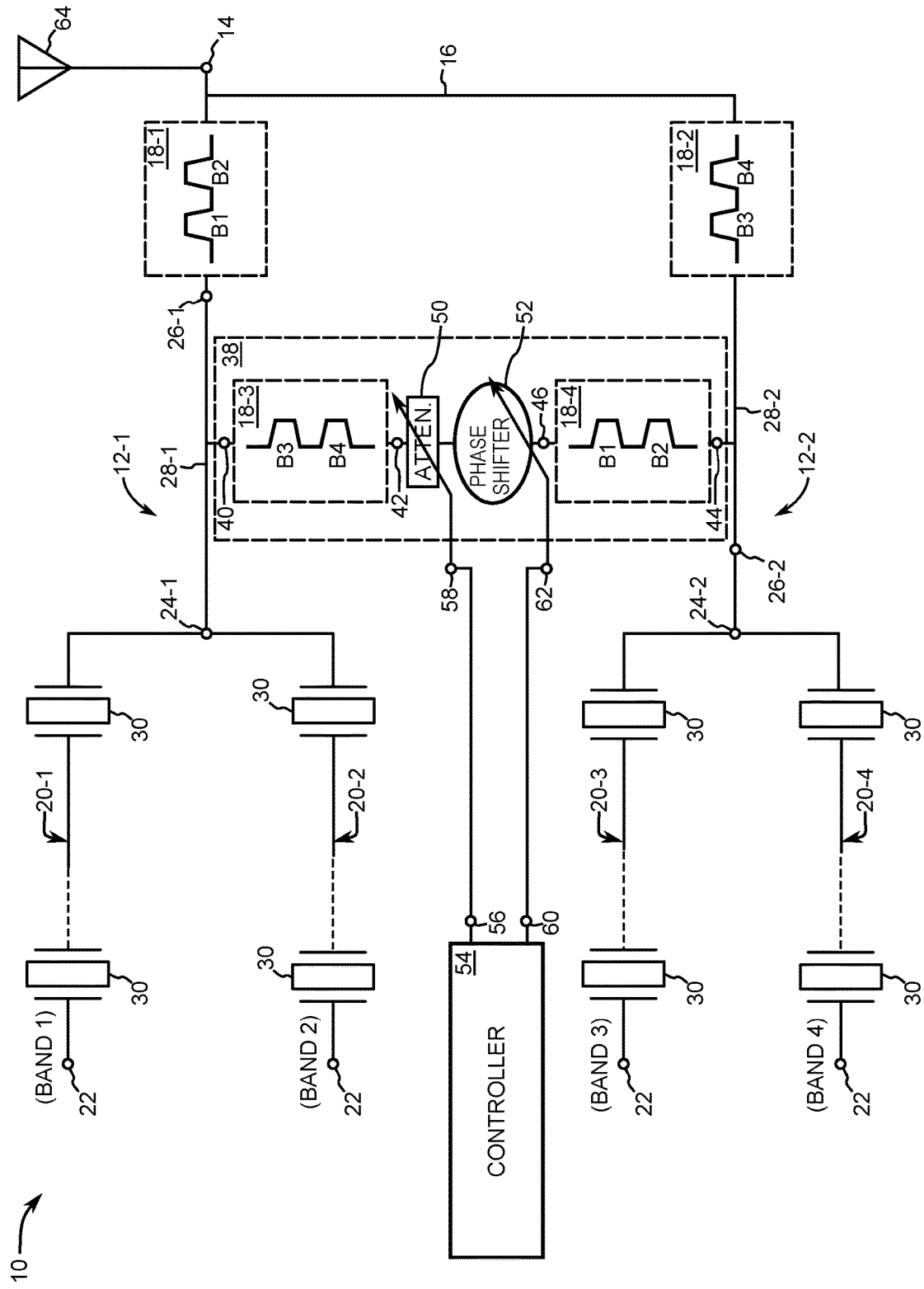
FIG. 4 is a schematic of a third exemplary embodiment of the radio frequency multiplexer in which a tunable attenuator and a tunable phase shifter are coupled in series within the mirrored cancellation network to maximize cancellation of undesirable signal leakage between adjacent multiplexer branches.

FIG. 4 is a schematic of a third exemplary embodiment of the radio frequency multiplexer 10. In this third embodiment, a tunable attenuator 50 and a tunable phase shifter 52 are coupled in series between the second filter terminal 42 and the fourth filter terminal 46. A controller 54 has a first control output 56 coupled to a first control input 58 of the tunable attenuator 50. The controller 54 has a second control output 60 coupled to a second control input 62 of the tunable phase shifter 52. The controller 54 may be either a digital processor such as a baseband processor or alternatively analog circuitry. In either case, the controller 54 is configured to tune the tunable attenuator 50 and tune the tunable phase shifter 52 to maximize cancellation of undesirable signal leakage that may occur between the first multiplexer branch 12-1 and the second multiplexer branch 12-2 under variable environmental conditions such as fluctuations in voltage standing wave ratio due to antenna impedance changes. In at least some embodiments, an antenna 64 is coupled to the common outer node 16.

Figure 5:
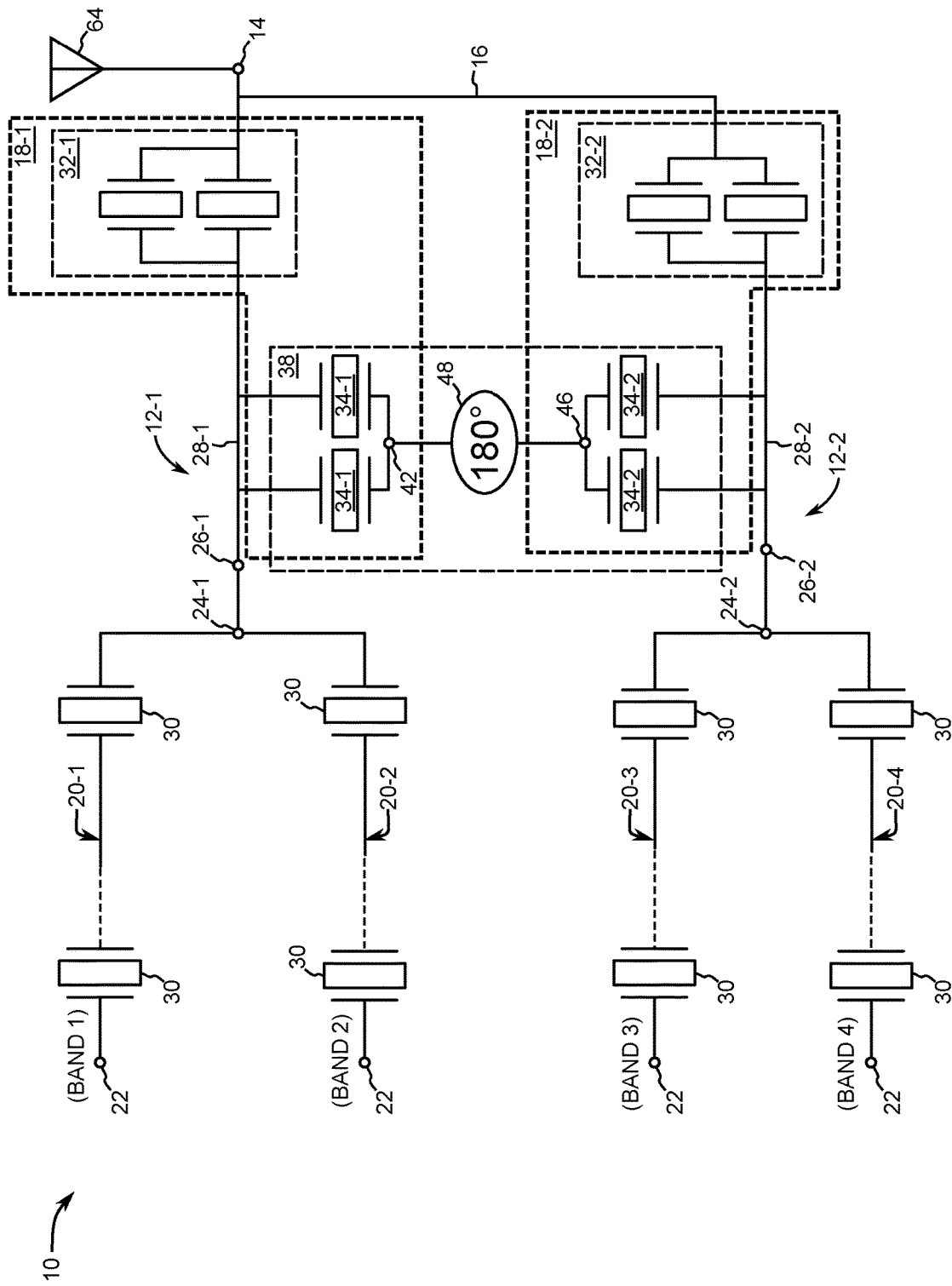
FIG. 5 is a schematic of a fourth exemplary embodiment of the radio frequency multiplexer that follows the general structure of the first embodiment depicted in FIG. 2 with the addition of a mirrored cancellation network.

FIG. 5 is a schematic of a fourth exemplary embodiment of the radio frequency multiplexer 10. The fourth embodiment follows the general structure of the first embodiment depicted in FIG. 2. However, in this fourth embodiment, a first plurality of shunt resonators 34-1 and a second plurality of shunt resonators 34-2 are not coupled to a fixed voltage node such as ground. Instead, the first plurality of shunt resonators 34-1 and the second plurality of shunt resonators 34-2 are coupled together through the 180° phase shifter 48 to realize the mirrored cancellation network 38 as first depicted in FIG. 3.

Figure 6:
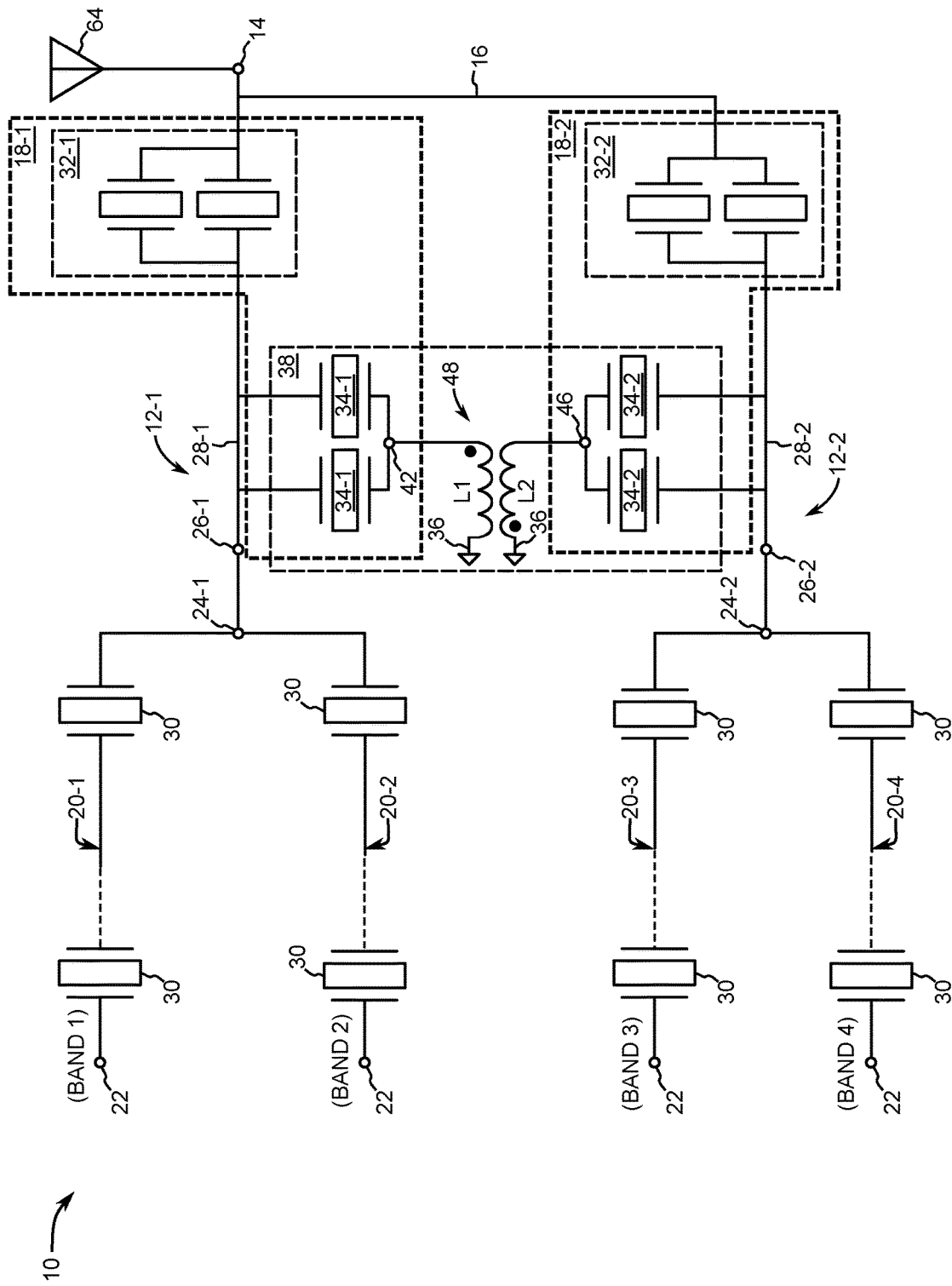
FIG. 6 is a schematic of the fourth exemplary embodiment of the radio frequency multiplexer in which a 180° phase shifter is realized with a first inductor that is magnetically negatively coupled to a second inductor.

FIG. 6 is a schematic of the fourth exemplary embodiment of the radio frequency multiplexer 10 in which the 180° phase shifter 48 is realized with a first inductor L1, which is magnetically negatively coupled to a second inductor L2.

The first inductor L1 is coupled between the second filter terminal 42 and the fixed voltage node 36 and the second inductor L2 is coupled between the fourth filter terminal 46 and the fixed voltage node 36. In this particular embodiment, the fixed voltage node is at ground potential. Inductances of the first inductor L1 and the second inductor L2 are on the order of nanohenries.

Figure 7:
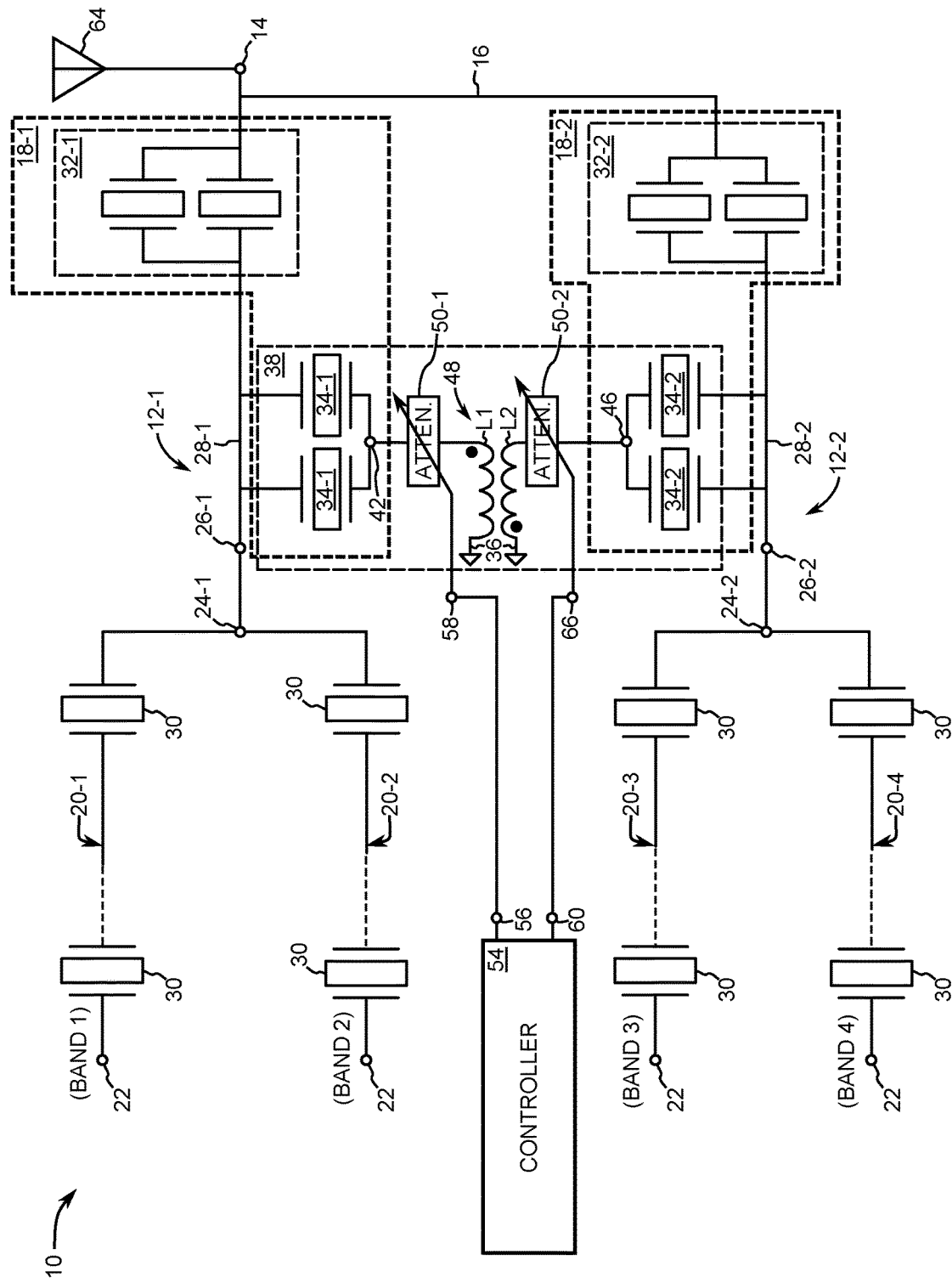
FIG. 7 is a schematic of a fifth exemplary embodiment of the radio frequency multiplexer that includes a first tunable attenuator that is coupled in series with the first inductor and a second tunable attenuator that is coupled in series with the second inductor.

FIG. 7 is a schematic of a fifth exemplary embodiment of the radio frequency multiplexer 10 that includes a first tunable attenuator 50-1 that is coupled in series with the first inductor L1 between the second filter terminal 42 and the fixed voltage node 36. A second tunable attenuator 50-2 is coupled in series with the second inductor L2 between the fourth filter terminal 46 and the fixed voltage node 36. Similar to the fourth embodiment, the first inductor L1 is magnetically negatively coupled to the second inductor L2 to realize the 180° phase shifter 48. The controller 54 has the first control output 56 coupled to the first control input 58 of the first tunable attenuator 50-1. The controller 54 has the second control output 60 coupled to an attenuation control input 66 of the second tunable attenuator 50-2. The controller 54 is configured to tune the first tunable attenuator 50-1 and tune the second tunable attenuator 50-2 to maximize cancellation of undesirable signal leakage that may occur between the first multiplexer branch 12-1 and the second multiplexer branch 12-2 under variable environmental conditions such as fluctuations in voltage standing wave ratio due to antenna impedance changes.

Figure 8:
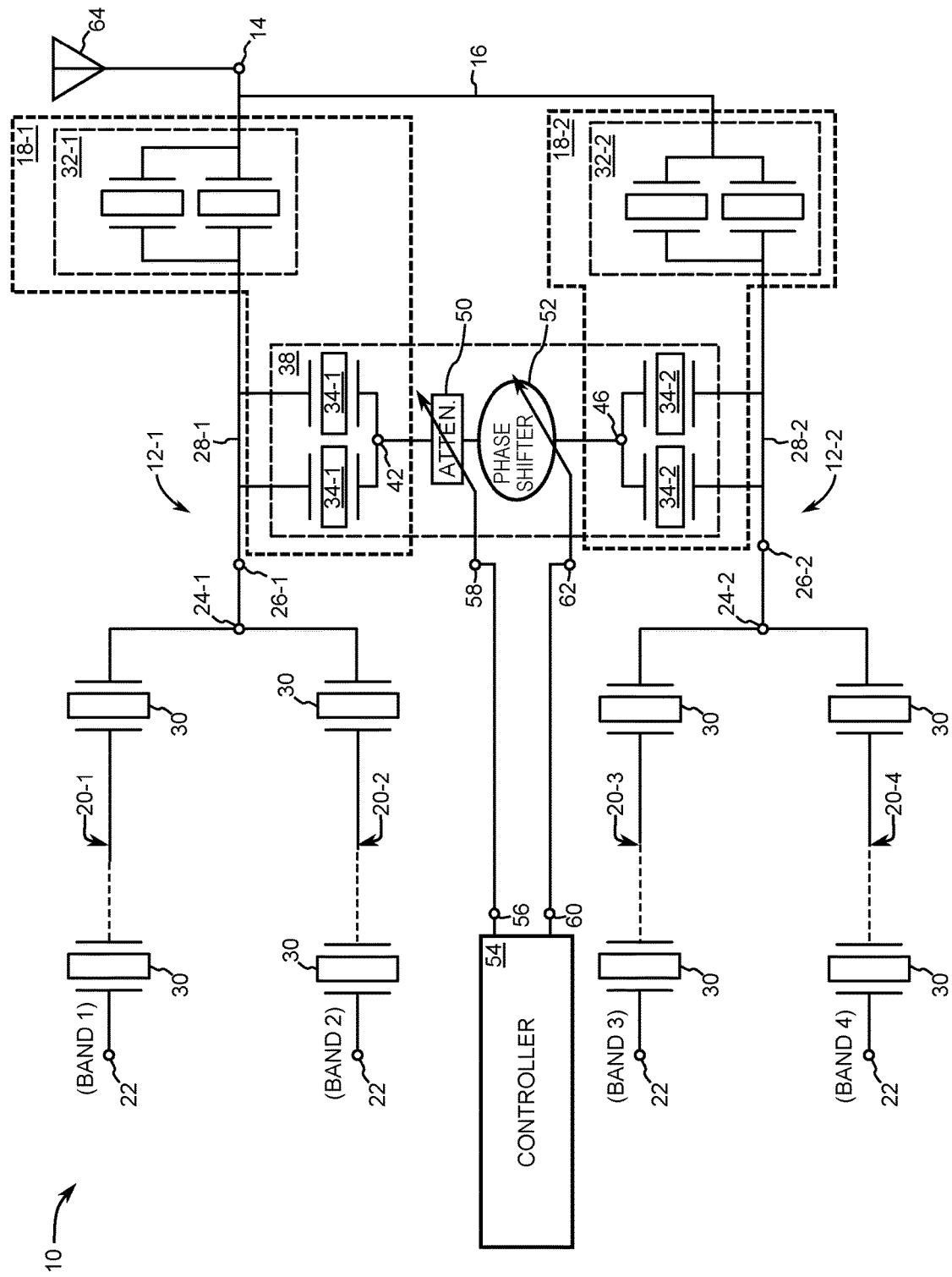
FIG. 8 is a schematic of a sixth exemplary embodiment of the radio frequency multiplexer in which a first plurality of shunt resonators and second plurality of shunt resonators are coupled together through a tunable attenuator and a tunable phase shifter that are coupled in series.

FIG. 8 is a schematic of a sixth exemplary embodiment of the radio frequency multiplexer 10. The sixth exemplary embodiment follows the structure of the more general third embodiment depicted in FIG. 4. However, in this fourth embodiment, the first plurality of shunt resonators 34-1 and the second plurality of shunt resonators 34-2 are coupled together through the tunable attenuator 50 and the tunable phase shifter 52 that are coupled in series between the second filter terminal 42 and the fourth filter terminal 46 to realize the mirrored cancellation network 38.

In this sixth embodiment, the controller 54 has the first control output 56 coupled to the first control input 58 of the tunable attenuator 50. The controller 54 has the second control output 60 coupled to the second control input 62 of the tunable phase shifter 52. The controller 54 is configured to tune the tunable attenuator 50 and tune the tunable phase shifter 52 to maximize cancellation of undesirable signal leakage that may occur between the first multiplexer branch 12-1 and the second multiplexer branch 12-2 under variable environmental conditions such as fluctuations in voltage standing wave ratio due to antenna impedance changes.

Figure 9:
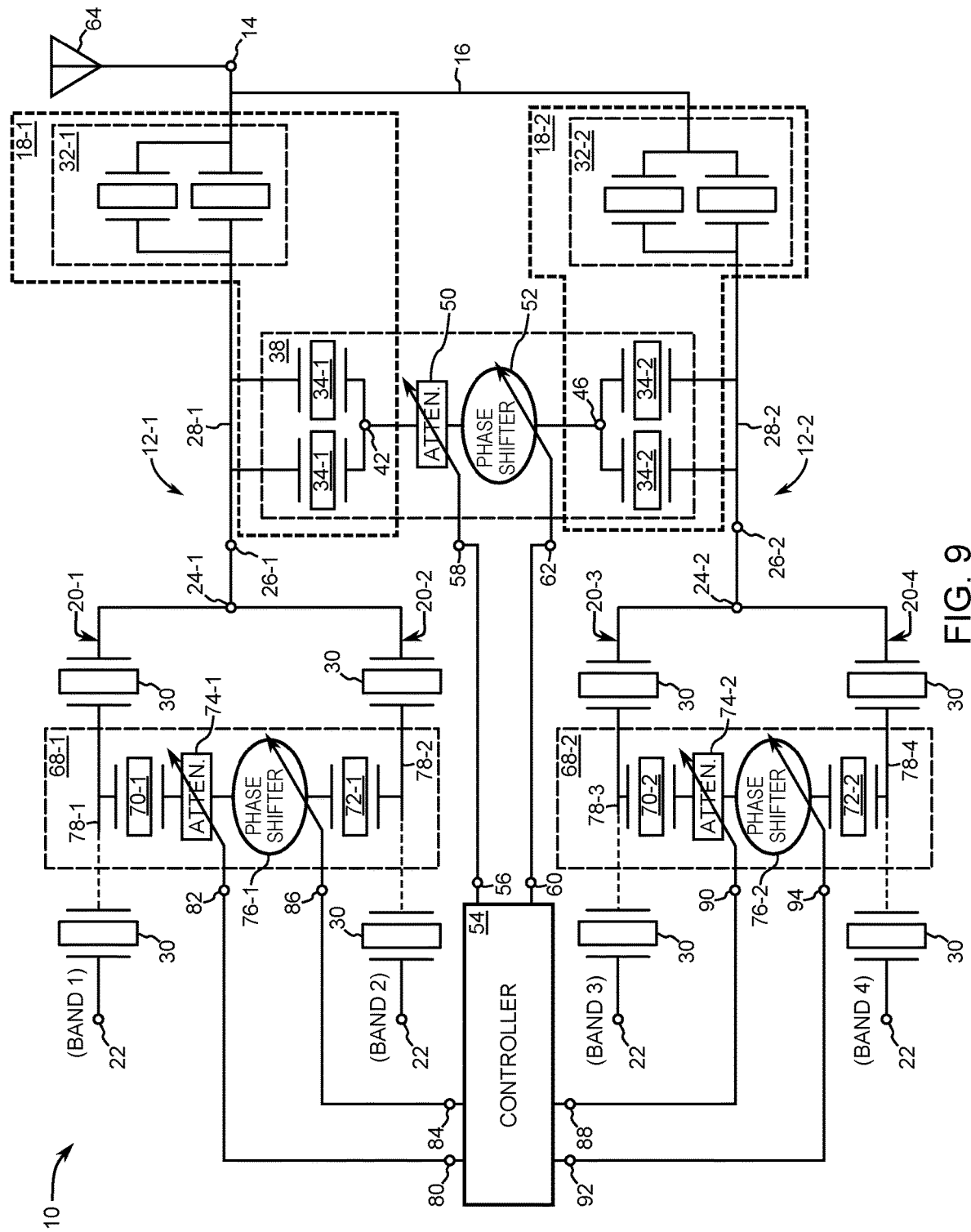
FIG. 9 is a schematic of a seventh exemplary embodiment of the radio frequency multiplexer that provides additional mirrored cancellation of undesirable signal leakage by way of a mirrored cancellation mini-network that is configured to substantially reduce the undesired signal leakage that may occur between adjacent resonator branches.

FIG. 9 is a schematic of a seventh exemplary embodiment of the radio frequency multiplexer 10. The seventh exemplary embodiment follows the structure of the sixth embodiment depicted in FIG. 8. However, the seventh embodiment provides additional mirrored cancellation of undesirable signal leakage. This particular exemplary embodiment includes mirrored cancellation mini-networks 68 that are configured to substantially reduce the undesired signal leakage that may occur between adjacent ones of the N number of resonator branches 20 within corresponding ones of the multiplexer branches 12-1 through 12-M, which in this exemplary case are the multiplexer branches 12-1 and 12-2. Generally, the mirrored cancellation mini-networks 68 are coupled between adjacent ones of the N number of resonator branches 20 within corresponding ones of the multiplexer branches 12-1 through 12-M.

In this regard, FIG. 9 depicts an exemplary embodiment of a first mirrored cancellation mini-network 68-1 that includes a first top resonator 70-1, a first bottom resonator 72-1, a first mini-tunable attenuator 74-1, and a first mini-tunable phase shifter 76-1. The first top resonator 70-1, the first bottom resonator 72-1, the first mini-tunable attenuator 74-1, and the first mini-tunable phase shifter 76-1 are coupled in series between adjacent ones of the N number of resonator branches 20, which in this case are the first resonator branch 20-1 and the second resonator branch 20-2. In particular, the first mirrored cancellation mini-network 68-1 is coupled between a first resonator branch node 78-1 and a second resonator branch node 78-2.

In the exemplary embodiment of FIG. 9, the first top resonator 70-1 is configured to provide a low impedance path for undesired leakage signals of the second band B2 and provide high impedance to the first band B1 signals. In this particular case, the first mirrored cancellation mini-network 68-1 is configured to cancel signals from the second band B2 that leak from the first common inner node 28-1 into the first resonator branch 20-1. Moreover, the first bottom resonator 72-1 is configured to provide a low impedance path for undesired leakage signals of the first band B1 and provide high impedance to the second band B2 signals. In this particular case, the first mirrored cancellation mini-network 68-1 is configured to cancel signals from the first band B1 that leak from the first common inner node 28-1 into the second resonator branch 20-2.

FIG. 9 also depicts a second mirrored cancellation mini-network 68-2 that includes a second top resonator 70-2, a second bottom resonator 72-2, a second mini-tunable attenuator 74-2, and a second mini-tunable phase shifter 76-2. The second top resonator 70-2, the second bottom resonator 72-2, the second mini-tunable attenuator 74-2, and the second mini-tunable phase shifter 76-2 are coupled in series between adjacent ones of the N number of resonator branches 20, which in this case are the third resonator branch 20-3 and the fourth resonator branch 20-4. In particular, the second mirrored cancellation mini-network 68-2 is coupled between a third resonator branch node 78-3 and a fourth resonator branch node 78-4.

In the exemplary embodiment of FIG. 9, the second top resonator 70-2 is configured to provide a low impedance path for undesired leakage signals of the fourth band B4 and provide high impedance to the third band B3 signals. In this particular case, the second mirrored cancellation mini-network 68-2 is configured to cancel signals from the fourth band B4 that leak from the second common inner node 28-2 into the third resonator branch 20-3. Moreover, the second bottom resonator 72-2 is configured to provide a low impedance path for undesired leakage signals of third band B3 and provide high impedance to fourth band B4 signals. In this particular case, the second mirrored cancellation mini-network 68-2 is configured to cancel signals from the third band B3 that leak from the second common inner node 28-2 into the fourth resonator branch 20-4.

As first depicted in FIG. 2, the exemplary embodiment of FIG. 9 also includes the controller 54 with the first control output 56 coupled to the first control input 58 of the tunable attenuator 50. The controller 54 also retains the second control output 60 coupled to the second control input 62 of the tunable phase shifter 52. In the exemplary embodiment of FIG. 9, the controller 54 further includes a third control output 80 coupled to a third control input 82 of the first mini-tunable attenuator 74-1. A fourth control output 84 of the controller 54 is coupled to a fourth control input 86 of the first mini-tunable phase shifter 76-1. A fifth control output 88 of the controller 54 is coupled to a fifth control input 90 of the second mini-tunable attenuator 74-2. A sixth control output 92 of the controller 54 is coupled to a sixth control input 94 of the second mini-tunable phase shifter 76-2.

As previously stated, the controller 54 may be either a digital processor such as a baseband processor or alternatively analog circuitry. In either case, the controller 54 is configured to tune the tunable attenuator 50 and tune the tunable phase shifter 52 to maximize cancellation of undesirable signal leakage that may occur between the first multiplexer branch 12-1 and the second multiplexer branch 12-2 under variable environmental conditions such as fluctuations in voltage standing wave ratio due to antenna impedance changes. Moreover, the controller 54 is further configured to tune the first mini-tunable attenuator 74-1 and tune the first mini-tunable phase shifter 76-1 to maximize cancellation of undesirable signal leakage that may occur between the first resonator branch 20-1 and the second resonator branch 20-2 under variable conditions such as changes in process and temperature. Further still, the controller 54 is also configured to tune the second mini-tunable attenuator 74-2 and tune the second mini-tunable phase shifter 76-2 to maximize cancellation of undesirable signal leakage that may occur between the third resonator branch 20-3 and the fourth resonator branch 20-4 under variable conditions such as changes in process and temperature.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency multiplexer comprising:
an M number of multiplexer branches each having an outer port terminal coupled to a common outer node, wherein M is a counting number greater than one and each of the M number of multiplexer branches comprises:
a multi-bandpass filter configured to filter an N number of bands multiplexed by the radio frequency multiplexer to pass an individual group of N/M bands, wherein N is a positive counting number greater than one; and
an N/M number of resonator branches each having a band port terminal configured to pass a single band and an inner branch terminal coupled to an inner port terminal of the multi-bandpass filter at a common inner node.

2. The radio frequency multiplexer of claim 1 wherein each of the multi-bandpass filters comprises a plurality of series resonators coupled in parallel between the inner port terminal and the outer port terminal, wherein the plurality of series resonators is configured to provide low impedance paths between the outer port terminal and the inner port terminal for the individual group of N/M bands passed by the multi-bandpass filter and also to provide substantially higher impedance to undesired bands of frequencies.

3. The radio frequency multiplexer of claim 2 wherein each series resonator of the plurality of series resonators is a surface acoustic wave resonator.

4. The radio frequency multiplexer of claim 2 wherein each series resonator of the plurality of series resonators is a bulk acoustic wave resonator.

5. The radio frequency multiplexer of claim 1 wherein each of the N/M number of resonator branches comprises a plurality of acoustic resonators coupled in series between the band port terminal and the inner branch terminal.

6. The radio frequency multiplexer of claim 5 wherein each of the acoustic resonator of the plurality of acoustic resonators is a surface acoustic wave resonator.

7. The radio frequency multiplexer of claim 5 wherein each of the acoustic resonator of the plurality of acoustic resonators is a bulk acoustic wave resonator.

8. The radio frequency multiplexer of claim 1 further comprising a plurality of shunt resonators coupled between the common inner node and a fixed voltage node.

9. The radio frequency multiplexer of claim 8 wherein the fixed voltage node is ground.

10. The radio frequency multiplexer of claim 8 wherein each of the plurality of shunt resonators is a surface acoustic wave resonator.

11. The radio frequency multiplexer of claim 8 wherein each of the plurality of shunt resonators is a bulk acoustic wave resonator.

12. The radio frequency multiplexer of claim 1 further comprising a mirrored cancellation network coupled between the common inner nodes of adjacent ones of the M number of multiplexer branches, wherein the mirrored cancellation network is configured to cancel undesirable signal leakage between the adjacent ones of the M number of multiplexer branches.

13. The radio frequency multiplexer of claim 12 wherein the mirrored cancellation network comprises:
a first shunt multi-bandpass filter having a first filter terminal coupled to the common inner node of a first one of an adjacent pair of the M number of multiplexer branches and a second filter terminal;
a second shunt multi-bandpass filter having a third filter terminal coupled to the common inner node of a second one of the adjacent pair of the M number of multiplexer branches and a fourth filter terminal; and
a phase shifter coupled between the second filter terminal and the fourth filter terminal, wherein the phase shifter is configured to provide 180°±5° phase shift and the first shunt multi-bandpass filter is configured to pass signals passed by the second one of the adjacent pair of the M number of multiplexer branches and the second shunt multi-bandpass filter is configured to pass signals passed by the first one of the adjacent pair of the M number of multiplexer branches.

14. The radio frequency multiplexer of claim 13 wherein the first shunt multi-bandpass filter comprises a first plurality of parallel coupled acoustic resonators coupled between the first filter terminal and the second filter terminal, and second shunt multi-bandpass filter comprises a second plurality of parallel coupled acoustic resonators coupled between the third filter terminal and the fourth filter terminal.

15. The radio frequency multiplexer of claim 13 wherein the phase shifter comprises a first inductor coupled between the second filter terminal and a fixed voltage node and a second inductor coupled between the fourth filter terminal and the fixed voltage node such that the first inductor and the second inductor are magnetically negatively coupled.

16. The radio frequency multiplexer of claim 12 wherein the mirrored cancellation network comprises:
a first shunt multi-bandpass filter having a first filter terminal coupled to the common inner node of a first one of an adjacent pair of the M number of multiplexer branches and a second filter terminal;
a second shunt multi-bandpass filter having a third filter terminal coupled to the common inner node of a second one of the adjacent pair of the M number of multiplexer branches and a fourth filter terminal;
a tunable attenuator having a first control input; and a tunable phase shifter having a second control input, wherein the tunable attenuator and the tunable phase shifter are coupled in series between the second filter terminal and the fourth filter terminal, wherein the first shunt multi-bandpass filter is configured to pass signals passed by the second one of the adjacent pair of the M number of multiplexer branches and the second shunt multi-bandpass filter is configured to pass signals passed by the first one of the adjacent pair of the M number of multiplexer branches.

17. The radio frequency multiplexer of claim 16 further comprising a controller having a first control output coupled to the first control input and a second control output coupled to the second control input, wherein the controller is configured to tune the tunable attenuator and tune the tunable phase shifter to maintain maximum cancellation of signals passed by both the first shunt multi-bandpass filter and the second shunt multi-bandpass filter.

18. The radio frequency multiplexer of claim 17 further comprising a mirrored cancellation mini-network coupled between the N/M number of resonator branches, wherein the mirrored cancellation mini-network is configured to cancel undesirable signal leakage between a first one of the adjacent pair of the N/M number of resonator branches and a second one of the adjacent pair of the N/M number of resonator branches.

19. The radio frequency multiplexer of claim 18 wherein the mirrored cancellation mini-network comprises:
 a top resonator configured to pass signals passed by the second one of the adjacent pair of the N/M number of resonator branches;
 a bottom resonator configured to pass signals passed by the first one of the adjacent pair of the N/M number of resonator branches;
 a mini-tunable attenuator; and
 a mini-tunable phase shifter, wherein the top resonator, the bottom resonator, the mini-tunable attenuator, and the mini-tunable phase shifter are coupled in series between the first one of the adjacent pair of the N/M number of resonator branches and the second one of the adjacent pair of the N/M number of resonator branches.

20. The radio frequency multiplexer of claim 19 wherein the controller is further configured to tune the mini-tunable attenuator and tune the mini-tunable phase shifter to maintain maximum cancellation of signals passed by both the top resonator and bottom resonator.

* * * * *